(12) United States Patent
Stenestam et al.

(10) Patent No.: US 7,145,760 B2
(45) Date of Patent: Dec. 5, 2006

(54) TAP CHANGER MONITORING

(75) Inventors: Bengt-Olof Stenestam, Ludvika (SE); Gunnar Andersson, Nyhammar (SE)

(73) Assignee: ABB Technology Ltd., Zürich (CH)

( * ) Notice: Subject to any disclaimer, the term of this patent is extended or adjusted under 35 U.S.C. 154(b) by 595 days.

(21) Appl. No.: 10/450,579

(22) PCT Filed: Dec. 14, 2001

(86) PCT No.: PCT/SE01/02782

§ 371 (c)(1),
(2), (4) Date: Jun. 16, 2003

(87) PCT Pub. No.: WO02/48729

PCT Pub. Date: Jun. 20, 2002

(65) Prior Publication Data

US 2005/0099741 A1    May 12, 2005

(51) Int. Cl.
*H01H 47/00*    (2006.01)
(52) U.S. Cl. .......................................... 361/115; 361/38
(58) Field of Classification Search ................ 361/115, 361/38

See application file for complete search history.

(56) References Cited

U.S. PATENT DOCUMENTS 3,173,086 A * 3/1965 Kresge ........................ 324/535
5,946,171 A * 8/1999 Magnier ....................... 361/37
6,023,404 A  2/2000 Marmonier
6,215,408 B1  4/2001 Léonard et al.
6,446,027 B1 * 9/2002 O'Keeffe et al. ........... 702/183

FOREIGN PATENT DOCUMENTS

| JP | 61-018113 | 1/1986 |
|---|---|---|
| JP | 01-095505 | 4/1989 |
| JP | 02-213105 | 8/1990 |
| WO | WO 93/23760 | 11/1993 |

* cited by examiner

*Primary Examiner*—Stephew W. Jackson
(74) *Attorney, Agent, or Firm*—Venable LLP; Eric J. Franklin

(57) ABSTRACT

A method and means for diagnosing transformer tap changers is provided. Pressure is monitored in an insulating liquid of a tap changer for a period of time in which switching of the tap changer is carried through. Switching-related information is extracted from the pressure diagram. Quantities from pressure peaks are related to specific arcings of the switching sequence. Early error detection is achieved, whereby transformed failures may be avoided. Repeated measurements may be followed by trend evaluation. If a trend indicating tap changer problems is detected, an alarm signal is triggered. The transformer may be switched off if the pressure exceeds a predetermined emergency value. Information of the base pressure in the tap changer may be extracted and converting it to level of insulating liquid.

20 Claims, 5 Drawing Sheets

TAP CHANGER MONITORING

TECHNICAL FIELD

The present invention relates in general to tap changers and in particular to a method and apparatus for diagnosing the condition of a tap changer.

BACKGROUND

High voltage and medium voltage transformers are widely used in electrical power distribution of today. Utilizing the magnetic features of electrical currents, they transfer power between two or more incompatible electrical AC-circuits. Thereby, power from a power plant can be transported by a small current of very high voltage and then stepped down to a large current of low voltage before reaching the users.

Supply authorities are under obligation to their customers to maintain the supply voltage between certain limits. A tap changer is a device used in a transformer for regulation of the transformer output voltage within these limits. Normally, this is achieved by changing the ratios of the transformers of the system by altering the number of turns in one winding of the appropriate transformer(s). A lower load on the system may for instance require that tap-changing operations decrease the number of turns in the winding. This ultimately results in an increased output voltage as compared to if no tap changing were performed. Normally, a tap changer performs in the range of 5–20 changing operations per day, but for very demanding systems, such as melting furnaces, there may be hundreds of such operations per day.

Besides the described application, tap changers may also be used in connection with other inductive power devices such as reactors. Tap changers are either on-load, i.e. operating while the transformer is energized, or off-load and there is a wide range of models available. A tap changer generally comprises a number of switches for tap changing and a number of resistors or other impedances to prevent short-circuiting. Furthermore, the tap changer typically is filled with an insulating liquid, such as oil, which besides insulation offers cooling of the device.

Problems during switching in tap changers are not usual, but can be very serious when they occur. Such problems are mostly related to a long switching time, in turn a result of e.g. wear or broken details. A major disadvantage is that the switching problems generally are not discovered before the tap changer becomes entirely unusable. Often the whole transformer has to be switched off in an emergency manner as a consequence of inadequate tap changing, which implies considerable inconveniences for the consumers as well as extremely high expenses for the power industry.

Inspection of a tap changer generally requires opening of the enclosure and removal of the switching mechanism from the oil. This causes a lengthy service interruption and is hence performed as seldom as possible. Thus, solving the error detection problem by tap changer inspections on a regular basis is not a desirable option.

It is known in the prior art to measure acoustic signals in tap changers to obtain information about the functional qualities thereof. According to U.S. Pat. No. 5,492,014 acoustic signals resulting from, among other things, tap-changing operations are measured. The "sound" of the operations is recorded and unusual sounds are used as indications of unusual events. Such acoustic measurements require specially adapted equipment and are often associated with problems due to resonance, spurious signals, disturbances, etc. Moreover, diagrams resulting from acoustic measurements are generally very difficult to interpret, in particular since every system has its own acoustic characteristics.

Accordingly, there is a strong demand for a method and means, which facilitates early detection of switching problems in a tap changer.

SUMMARY

A general object of the present invention is to improve diagnosing and error detection in tap changers. A specific object is to provide a diagnosing method and means for early detection of switching-related problems in a tap changer. Another object is to provide measuring means for early switching-error detection which are easy to implement.

These objects are achieved in accordance with the attached claims.

The present invention is based on the recognition that information about switching operations in a tap changer can be obtained from pressure monitoring of the tap changer insulating liquid. A diagnosing method is provided comprising registering pressure in an insulating liquid of a tap changer as a function of time for a period of time in which a switching action of the tap changer is carried through, and extracting switching-related information from the registered pressure diagram. The method is preferably used for a single-phase tap changer and comprises the step of relating quantities derived from the measured pressure peaks to specific arcings of the switching action. In this way, early error detection is achieved, whereby transformer failures can be avoided. Repeated measurements at different loads are preferably performed, followed by trend evaluation. If a trend indicating tap changer problems is detected, an alarm signal is triggered to call for a pre-scheduled tap changer inspection. The method according to the invention may further comprise switching off the transformer if the pressure exceeds a pre-determined value as well as extracting information of the base pressure in the tap changer and relating it to the level of insulating liquid. These features are very advantageous, since they replace conventional pressure guards and oil level sensors.

Another aspect of the present invention is to provide diagnosing means for a tap changer. Still other aspects of the invention are to provide a tap changer, a transformer comprising a tap changer and a computer program product for pressure monitoring and evaluation of tap changer conditions.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings the same reference numbers are used for similar or corresponding objects.

Figure 1:
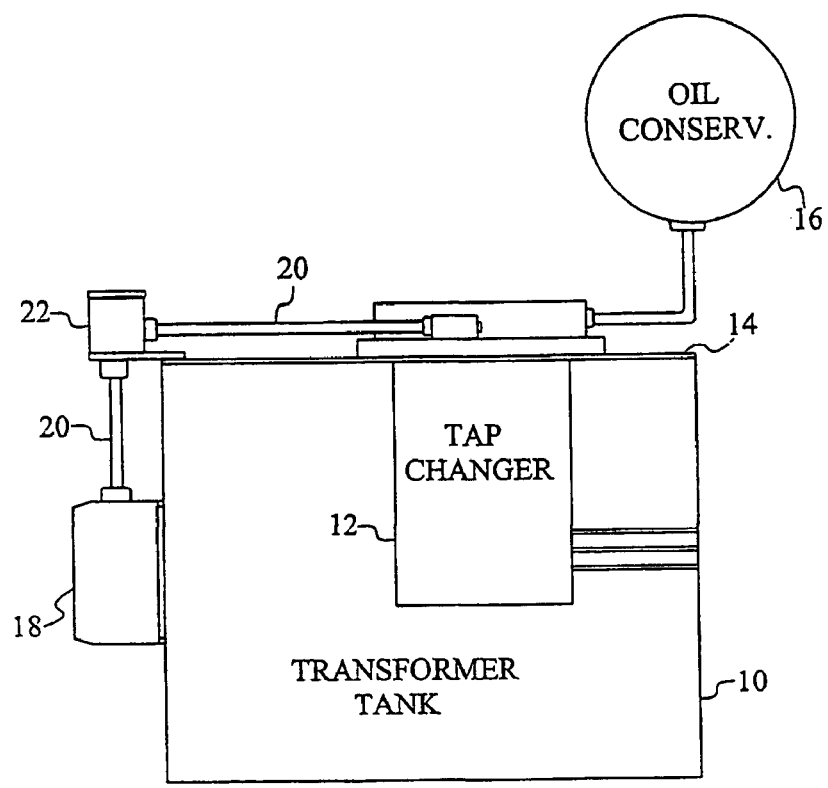
FIG. 1 is a schematic illustration of a transformer with a tap changer system which may be used with the present invention.

FIG. 1 is a schematic illustration of a transformer with a tap changer system which may be used with the present invention. A transformer tank 10 comprising a tap changer 12 is shown. The illustrated tap changer 12 is suspended from a transformer cover 14, but other tap changers 12 may be arranged outside the transformer tank 10. Both the transformer tank 10 and the tap changer 12 are filled with an insulating liquid, preferably oil, stored in an oil conservator 16. To avoid contamination of transformer oil, e.g. from arcing which will be described with reference to FIG. 3, the tap changer 12 has a tight housing separating its insulating liquid from the transformer insulating liquid. Power to operate the tap changer 12 is supplied from a motor-drive mechanism 18, which is mounted on the outside of the transformer tank 10. The power is transmitted by means of shafts 20 and bevel gears 22.

Figure 2:
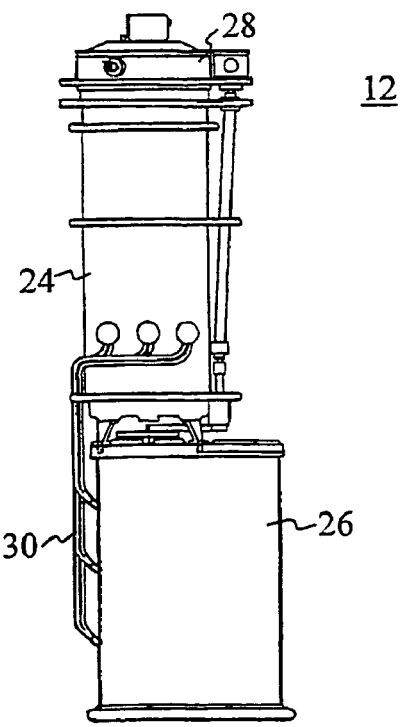
FIG. 2 is a schematic view of an on-load tap changer which may be used with the present invention.

FIG. 2 is a schematic view of an on-load tap changer, which may be used with the present invention. The illustrated tap changer 12 is of an UC type and detailed information thereof can be found in our technical guide "On-load tap changers, type UC" (available on the internet). The tap changer 12 is formed of two main parts, a diverter switch 24 and a tap selector 26, interrelated by connections 30. A conventional top housing 28 of the diverter switch 24 comprises a three-way valve onto which, besides connection flanges and connections for test equipment, a pressure guard (not shown) is mounted. The pressure guard trips a main circuit breaker of the transformer if a certain pressure level is exceeded. Thus, the complete transformer is switched off in the event of over-pressure and high oil flow rates in the conservator (16 in FIG. 1).

Basically, the tap selector 26 selects the desired tap upon initiation of a tap change. The diverter switch 24 then transfers the current from the tap in service to the selected tap. While this quick changeover is occurring, a resistance is cut into the circuit to ensure that there is no break in transfer of current. This also limits the circulating current between the two taps of the winding during the switching operation.

Figure 3A:
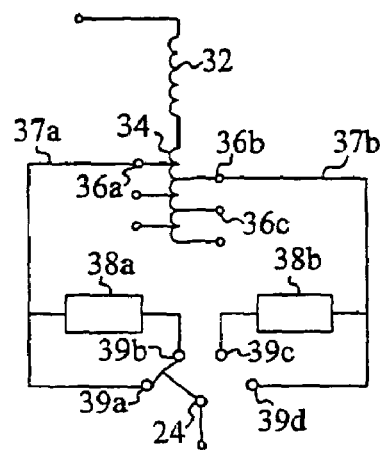
FIG. 3A–3F are circuit diagrams illustrating a switching sequence in the tap changer of FIG. 2.
Figure 3B:
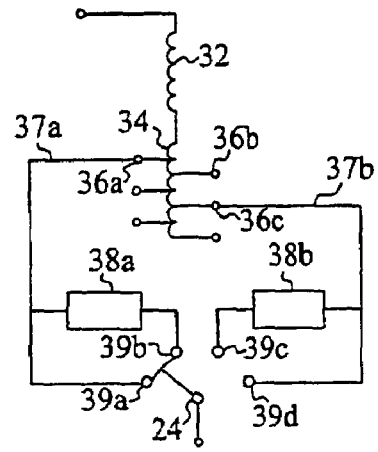
Figure 3C:
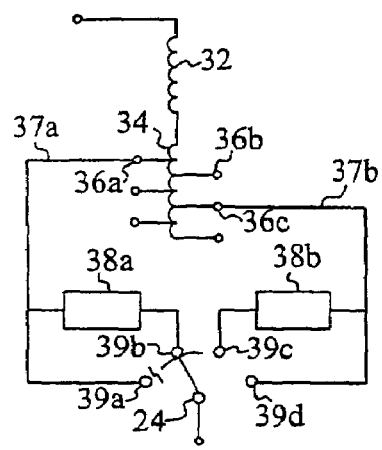

A switching sequence in the tap changer of FIG. 2 will now be described with reference to the circuit diagrams of FIG. 3A–3F. The circuit includes an untapped winding 32, a tapped winding 34 with taps 36a, 36b, 36c, tap selector contacts 37a, 37b, transition resistors 38a, 38b and the diverter switch 24 with main contacts 39a, 39d and transition contacts 39b, 39c. A duplicate circuit is provided in order to make one circuit carry the load current, while switching is carried out by the other. In FIG. 3A, the main contact 39a of the diverter switch 24 is closed, whereby the load current is allowed to bypass the resistor 38a and is carried directly to the selector contact 37a and tap 36a of the tapped winding 34. The selector contact 37b lies on a first tap 36b in the part of the circuit presently carrying no current (to the right in FIG. 3A). Still in a non-current state, selector contact 37b switches to a selected second tap 36c, resulting in FIG. 3B. Thereafter, the diverter switch 24 rotates clockwise making the main contact 39a break in such way that the current now flows via the transition contact 39b and the transition resistor 38a (FIG. 3C). The breaking occurs in the first current zero after contact separation.

Figure 3D:
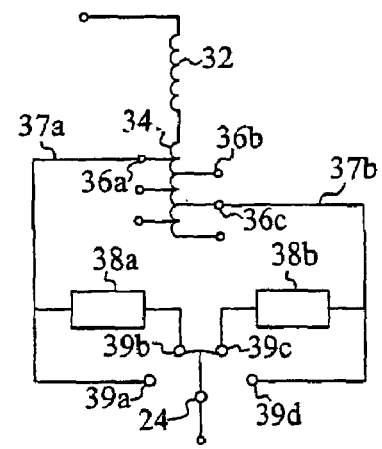

In the next step of the switching sequence, illustrated in FIG. 3D, the diverter switch 24 has continued to rotate clockwise. The transition contact 39c of the previously non-conducting circuit part is closed whereafter the load current is divided into two branches and a circulating current flows in the circuit between the taps 36a and 36c. The circulating current is limited by the two transition resistors 38a, 38b avoiding short-circuiting. When the transition contact 39b in the next stage (FIG. 3E) breaks, the entire load current flows via the transition resistor 38b from the selected tap 36c. Finally, in FIG. 3F, the switching sequence and thus the tap changing is completed with bypassing of the resistor 38b by connection of the main contact 39d and a full load current to tap 36c is obtained. The number of windings in the transformer and hence the voltage output level has been altered. A complete tap changing sequence of the described type typically lasts about 50 ms.

The present invention is not limited to the described tap changer circuit. Other embodiments may for instance use change-over selectors to achieve a reduced number of turns in the windings as compared to the described linear switching. Moreover, the number of resistors may vary and the resistors may be replaced by other impedances. The illustrated flag cycle operation may also be replaced by pennant cycle operation.

Figure 3E:
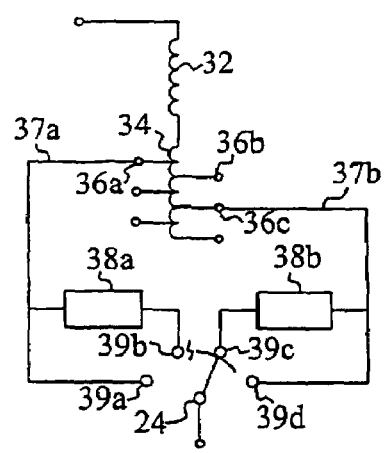
Figure 3F:
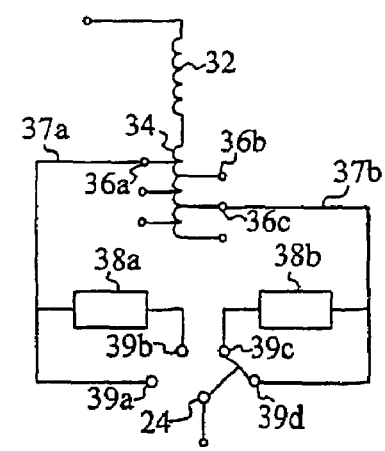

In the described embodiment there are thus two contact breaks in the diverter switch 24 during the described switching sequence, leading to the situations of FIGS. 3C and 3E, respectively. As the contacts break, the high voltage give rise to arcing indicated by flash-symbols in FIGS. 3C and 3E. In a successful switching operation, the life of an arc is completed within one half-cycle (max 10 ms at 50 Hz). The arcing causes thermal degradation of the insulating liquid, resulting in formation of volumes filled with gas. One consequence of this is that the gas formation in turn leads to sudden pressure changes in the insulating liquid. Since the insulating liquid has a limited compressibility and the casing is rigid, the pressure increase is distributed within the liquid and can be measured at almost any position. Another consequence of the thermal degradation is that the insulating liquid is contaminated.

The present invention is based on the recognition that information about switching operations in a tap changer can be obtained from pressure monitoring of the tap changer insulating liquid. As will be described in detail in the following, it has unexpectedly shown that pressure diagrams present a time resolution enough to identify different arcs and are therefore highly suitable as basis for extraction of switching-related information.

Figure 4:
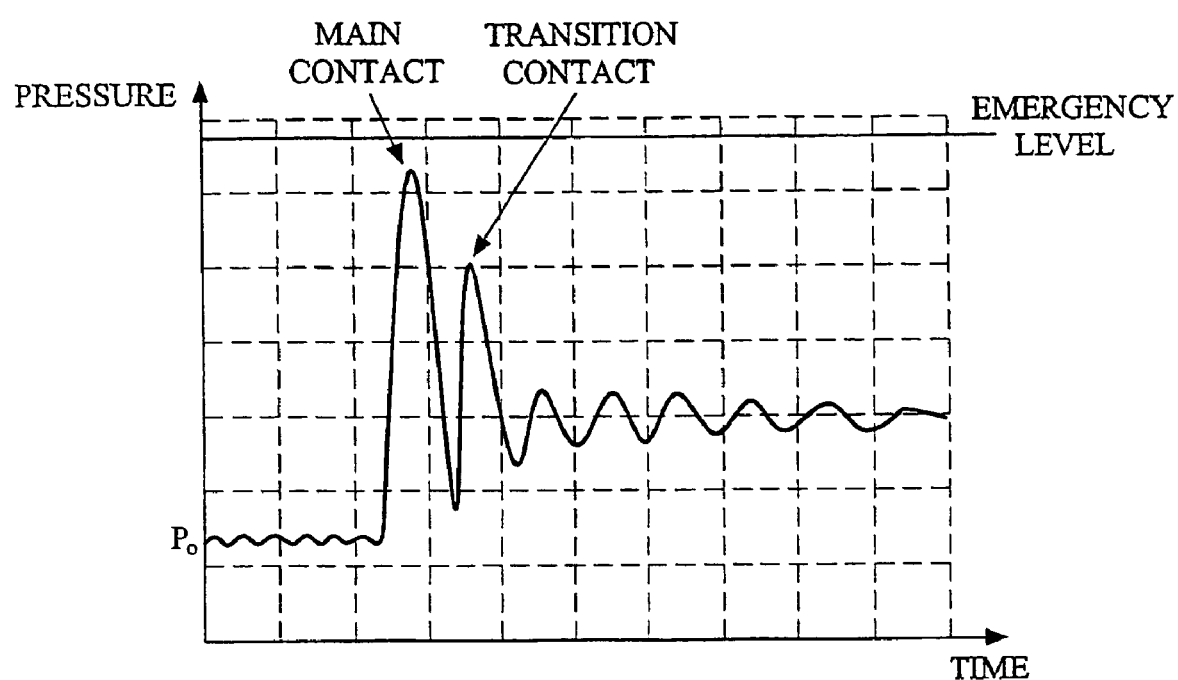
FIG. 4 is an exemplary diagram of pressure versus time obtained in accordance with the present invention.

FIG. 4 is an exemplary diagram of pressure versus time obtained in accordance with the present invention. Pressure was measured in the insulating liquid of a single-phase tap changer for a period of time well exceeding the tap changer switching time. The two arcs of the switching sequence (compare FIGS. 3C and 3E) give rise to two very distinct pressure peaks. The first pressure peak originates from the arc caused by breaking the main breaking contact, while the second peak is related to breaking of the transition contact. After the second arcing, and the associated pressure peak, the pressure in the tap changer fluctuates with lower amplitude and the mean pressure slowly decreases until the base pressure $P_0$ is regained. (FIG. 4 does not cover a time period long enough for this to be fully visible.)

Since the pressure peaks indisputably can be related to a respective arcing, features of the peaks, such as height, width and separation time, provides information of the arcing and thereby of the switch condition in the tap changer. Exemplary conclusions drawn from pressure diagrams of the type disclosed in FIG. 4 will now be given.

The intensity, i.e. a height or area measure, of a pressure peak is mainly related to the arc power. A high pressure peak implies fast formation of relatively large gas bubbles. This is due to a high electrical current and/or a relatively long arcing time. However, the arcing time may not exceed one half-cycle to manifest itself as a high pressure peak. If the arcing time, on the other hand, does exceed half a period, a relighted arc may be present, e.g. due to minor switching problems or overload. Since this leads to a relatively long duration of gas formation, it can be identified as a wide pressure peak. Thus, the width of a pressure peak generally provides information of the duration of the corresponding arc.

Evaluation of the separation in time of two pressure peaks, e.g. one from a main contact and one from a transition contact, provides very useful information about the tap changer switching speed. A relatively long period of time between the peaks indicates a low switching speed, or in other words a poor breaking ability. This could even result in a relighted arc implying wide peaks. Furthermore, the time between arcs correspond to well defined specifications of the tap changer switches. By comparing the time in the pressure diagram with the specifications, a deviation may be detected. Such a deviation indicates severe switching problems in the tap changer.

Finally, information about the status of the tap changer may also be retained from the time until the pressure reaches the base pressure $P_0$ following a switching sequence. A very long such decay time could be caused by a non-working connection to the expansion tank. Generally, this would also manifest itself as larger amplitudes of the oscillations following the transition contact peak.

It should be noted that the above-described diagnosing and error detection situations are merely given as examples. Of course, other switching-related information may as well be interpreted from a pressure diagram according to the present invention. Furthermore, the invention covers tap changer systems with different numbers of contact breaks, i.e. different arcing situations leading to other diagram characteristics. Embodiments with pennant cycle operation would for example disclose a different number of arcs and consequently a different number of peaks in the pressure diagram.

Preferably, diagnosing based on pressure monitoring according to the present invention is used for single-phase tap changers. Single-phase tap changers imply pressure diagrams similar to FIG. 4, in which the pressure peaks are clearly distinguishable and from which switching information hence is easy to extract. If the same measurement was performed for a multi-phase tap changer, where each phase implies a similar switching sequence as in FIG. 3, there would be two additional pressure peaks for each additional phase and a time delay between the pairs of peaks. The result could be overlapping pressure peaks, making the diagram interpretation somewhat more complicated. The invention covers tap changers of any number of phases, i.e. triple or other multiple-phase systems as well as single-phase tap changers. Nevertheless, it is evident that a single-phase tap changer is a system where the present invention is easiest to implement. Most favourable is to use the invention for tap changer systems with rigid devices and casings, since the peaks in the pressure diagram then become very sharp.

The pressure monitoring and diagram evaluation according to the present invention is preferably performed continuously or repeated at suitable time intervals. Then, pressure peaks formed at different loads on the tap changer system are registered. In this way, identification of trends related to switching features is possible. One embodiment of the invention comprises triggering of an alarm signal if e.g. an increasing or decreasing trend in the height or width of the pressure peaks is detected. The alarm signal implies that a pre-scheduled inspection of the tap changer should be performed whenever suitable.

The major benefit of the present invention is that it enables early detection of switching related errors. In the above-described way, incipient problems related to the tap changing function may be identified before they cause major damages. This implies that the occurrence of transformer failures decreases, which in turn is very advantageous for economical as well as environmental reasons.

There are additional advantages associated with embodiments of the invention. Firstly, the pressure monitoring according to the invention may be used to trig the pressure guard, i.e. to switch off the transformer when a pre-determined emergency pressure value is exceeded. The pressure diagram can be useful in order to determine whether the tap changer pressure really is increasing in a long-term point-of-view or if the pressure merely has risen instantaneously following a comparatively strong arcing. As a result, transformer failures due to "false" pressure alarms may be avoided, reducing the expenses of the power industry. Secondly, the base pressure of the pressure diagrams obtained in accordance with the present invention may be extracted and converted to the level of insulating liquid (generally oil) in the tap changer. In this way, no separate oil level sensor is needed in the tap changer.

Figure 5:
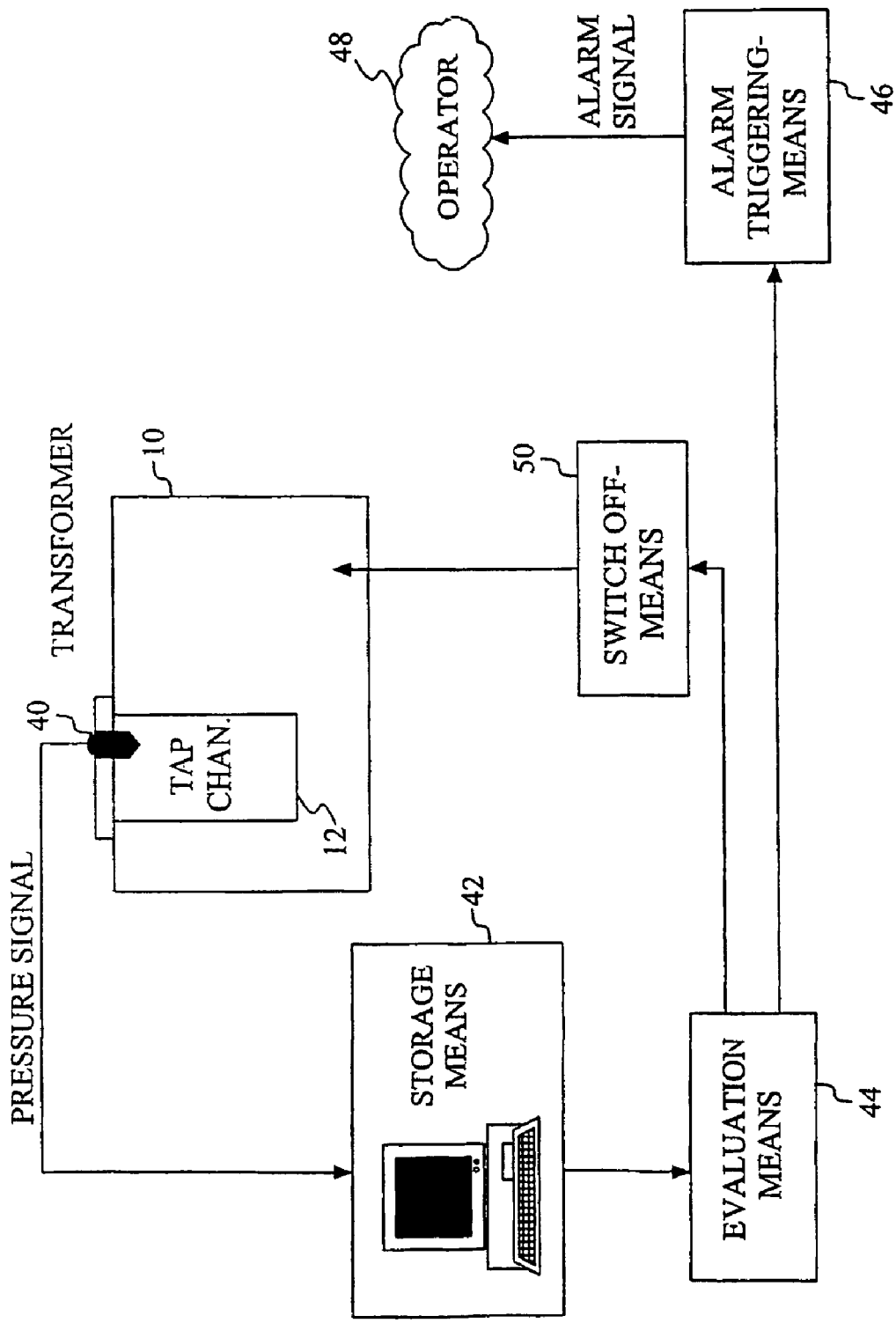
FIG. 5 illustrates a measurement set-up in accordance with the present invention.

FIG. 5 illustrates a measurement set-up in accordance with the present invention. The transformer tank 10, into which the tap changer 12 is suspended, is shown. A pressure sensor 40 measures the pressure of the insulating liquid in the tap changer 12. Preferably, a very fast pressure sensor 40 is used in order to properly register changes in the insulating liquid pressure during a tap changing sequence. For the measurements resulting in the diagram of FIG. 4 a pressure sensor of type DPI 260 available from Druck Ltd, with a response of 2 kHz, was used. The pressure sensor 40 is in a preferred embodiment of the invention arranged in the top housing (28 in FIG. 2) of the diverter switch. Existing connections may then be employed and a simple solution for pressure sensor implementation is achieved. This constitutes yet another advantage of the present invention.

The pressure signal is transferred from the pressure sensor 40 to means 42 for signal storing. From there, evaluation means 44 may collect data for diagnosing and evaluation for instance according to the above-described principles. When a trend is detected, the evaluation means 44 makes alarm-triggering means 46 release an alarm signal notifying an operator 48 of the need for tap changer inspection. Such an inspection typically involves both the transformer and the tap changer 12. The evaluation means also communicates with means 50 for switching off the transformer. For the case of (non-false) over-pressure, the switch off-means 50 turns off the transformer. The actual hardware of the described means 42, 44, 46, 50 is conventional as such and will not be described further herein, since it is not in itself constituting a part of the present invention. However, the use thereof in this particular arrangement is new.

Figure 6:
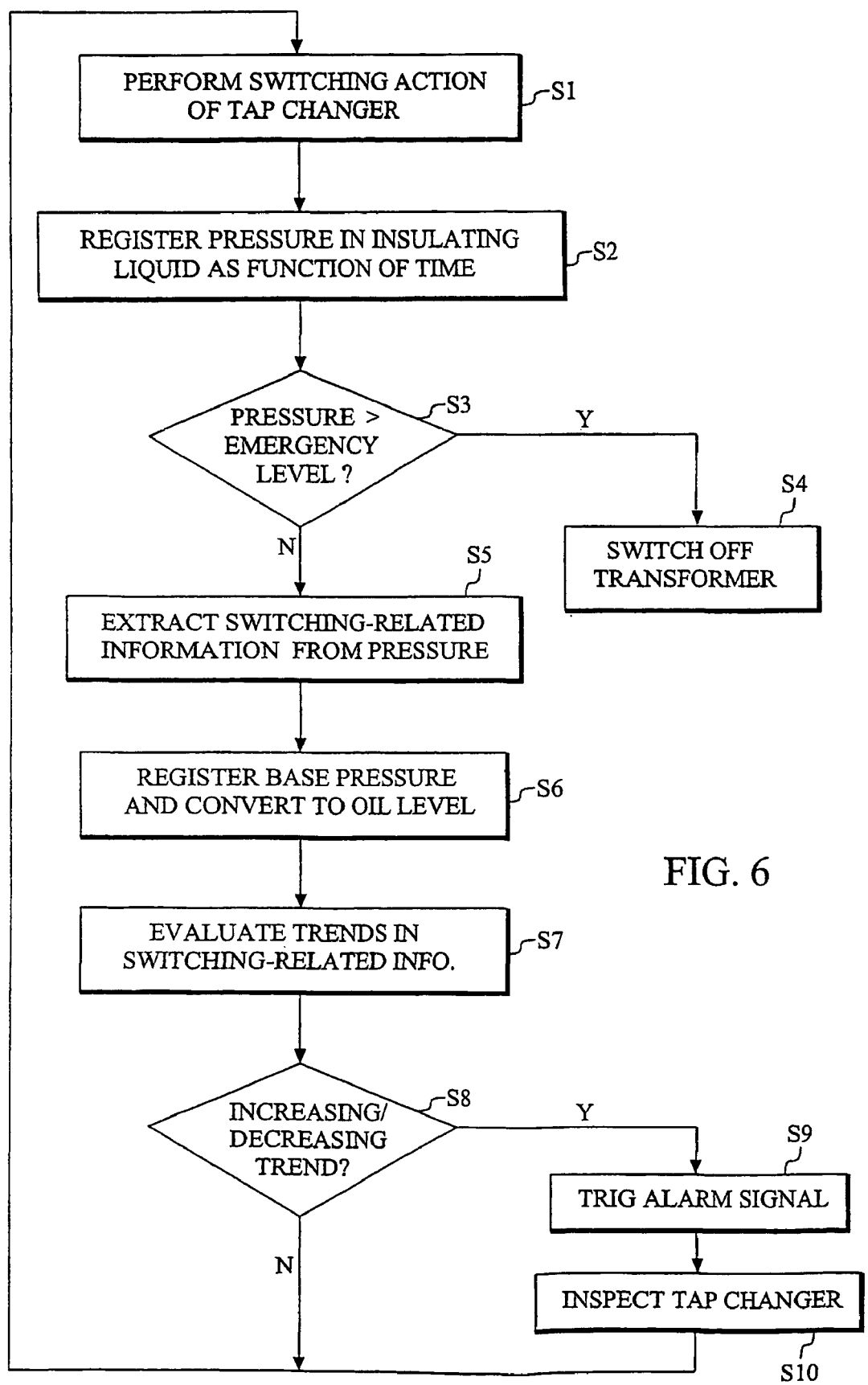
FIG. 6 is a flow diagram of a method of tap changer diagnosing in accordance with the present invention.

FIG. 6 is a flow diagram of a method of tap changer diagnosing in accordance with the present invention. In step S1, a switching action of a tap changer is performed. The pressure in the insulating liquid of the tap changer is registered as a function of time in step S2. In step S3, it is examined whether the tap changer pressure exceeds a pre-determined emergency level and preferably controlled that the change is not caused by known normal switching operations. If so is the case, the over-pressure results in switching off the transformer in step S4. If no over-pressure is at hand, pressure diagrams can be used to extract switching-related information in step S5. Furthermore, the base pressure may be registered and converted to level of insulating liquid in step S6. Preferably, the pressure measuring is repeated for a time period covering numerous switching actions at different loads on the tap changer. When several pressure diagrams have been recorded, trends in switching-related information can be evaluated in step S7. Step S8 checks whether there is an increasing or decreasing trend in switching-related information. Of course this involves determining how large a deviation has to be to imply a significant trend. If there is a significant trend, an alarm signal is triggered in step S9, whereafter the tap changer preferably is inspected in step S10. Otherwise, the diagnosing method steps are repeated beginning with the switching action in the step S1.

The method according to the present invention may be implemented by means of software, hardware, or a combination thereof. A computer program product implementing the method or a part thereof comprises a software or a computer program run on a general purpose or specially adapted computer, processor or microprocessor. The software includes computer program code elements or software code portions that make the computer perform the method using at least one of the steps previously described in FIG. 6. The program may be stored in whole or part, on, or in, one or more suitable computer readable media or data storage means such as a magnetic disk, CD-ROM or DVD disk, hard disk, magneto-optical memory storage means, in RAM or volatile memory, in ROM or flash memory, as firmware, or on a data server.

Although the invention has been described herein with reference to specific illustrated embodiments thereof, it should be emphasized that the invention also covers equivalents to the disclosed features, as well as modifications and variants thereof that are obvious to the man skilled in the art. Therefore, the scope of the invention should only be limited by the enclosed claims.

The invention claimed is:

1. A diagnosing method for a tap changer having an insulating liquid, the method comprising:
    performing a switching action of said tap changer;
    registering pressure in said insulating liquid as a function of time for a period of time comprising the time in which said switching action is carried through; and
    extracting switching-related information from said registered pressure function, said extracting comprising
    identifying a first pressure peak in said registered pressure function;
    relating quantities from said first pressure peak to quantities of a first arcing of said switching action;
    relating said quantities of said first arcing to breaking a first contact of a diverter switch in said tap changer during said switching action; and
    diagnosing a switching condition associated with said first contact, the switching condition being an error condition when quantities are outside a predetermined interval.

2. The method according to claim 1, wherein said extracting further comprises
    identifying a second pressure peak in said registered pressure function;
    relating quantities from said second pressure peak to quantities of a second arcing of said switching action;
    relating said quantities of said second arcing to breaking a second contact of said diverter switch in said tap changer during said switching action; and
    diagnosing a switching condition associated with said second contact, the switching condition being an error condition when quantities are outside a predetermined interval.

3. The method according to claim 2, wherein said first contact is a main contact of said diverter switch in said tap changer and said second contact is a transition contact of said diverter switch.

4. The method according to claim 2, wherein said extracting further comprises
    relating the time separation between said first and second pressure peaks to switching speed.

5. The method according to claim 1, wherein said extracting further comprises
    relating a width of said first and/or second pressure peak to arc duration.

6. The method according to claim 1, wherein said extracting further comprises
    relating an intensity measure of said first and/or second pressure peak to arc power.

7. The method according to claim 1, wherein said tap changer is a single-phase tap changer.

8. The method according to claim 1, further comprising:
    extracting information of a base pressure in said tap changer; and
    converting said base pressure to a level of insulating liquid in said tap changer.

9. The method according to claim 1, wherein said registering is repeated, the method further comprising:
    evaluating trends in said switching-related information.

10. The method according to claim 9, further comprising:
    triggering an alarm signal if an increasing or decreasing trend in said switching-related information is detected.

11. The method according to claim 1, wherein said insulating liquid is oil.

12. Diagnosing means for a tap changer having an insulating liquid, the diagnosing means comprising:
    means for registering pressure in said insulating liquid as a function of time for a period of time comprising the time in which a switching action of said tap changer is carried through,
    means for extracting switching-related information from said registered pressure function comprising
    means for identifying a first pressure peak in said registered pressure function;
    means for relating quantities from said first pressure peak to quantities of a first arcing of said switching action;
    means for relating said quantities of said first arcing to breaking a first contact of a diverter switch in said tap changer during said switching action; and
    means for diagnosing a switching condition associated with said first contact, the switching condition being an error condition when quantities are outside a predetermined interval.

13. The diagnosing means according to claim 12, wherein said tap changer is a single-phase tap changer.

14. The diagnosing means according to claim 12, further comprising:
    means for repeating said registering step,
    means for storing said registered pressure functions, and
    means for evaluating trends in said switching-related information.

15. The diagnosing means according to claim 14, further comprising:
    means for triggering an alarm signal if an increasing or decreasing trend in said switching-related information is detected.

16. A tap changer having an insulating liquid and comprising means for performing a switching action of said tap changer and diagnosing means comprising
- means for registering pressure in said insulating liquid as a function of time for a period of time comprising the time in which said switching action is carried through,
- means for extracting switching-related information from said registered pressure function comprising
- means for identifying a first pressure peak in said registered pressure function;
- means for relating quantities from said first pressure peak to quantities of a first arcing of said switching action;
- means for relating said quantities of said first arcing to breaking a first contact of a diverter switch in said tap changer during said switching action; and
- means for diagnosing a switching condition associated with said first contact, the switching condition being an error condition when quantities are outside a predetermined interval.

17. A transformer with a tap changer having an insulating liquid and comprising means for performing a switching action of said tap changer and diagnosing means comprising
- means for registering pressure in said insulating liquid as a function of time for a period of time comprising the time in which said switching action is carried through,
- means for extracting switching-related information from said registered pressure function comprising
- means for identifying a first pressure peak in said registered pressure function;
- means for relating quantities from said first pressure peak to quantities of a first arcing of said switching action;
- means for relating said quantities of said first arcing to breaking a first contact of a diverter switch in said tap changer during said switching action; and
- means for diagnosing a switching condition associated with said first contact, the switching condition being an error condition when quantities are outside a predetermined interval.

18. A computer program product, comprising: a computer readable medium; and
- computer code means and/or software code portions recorded on the computer readable medium for making a processor perform the steps of
- performing a switching action of said tap changer;
- registering pressure in said insulating liquid as a function of time for a period of time comprising the time in which said switching action is carried through;
- extracting switching-related information from said registered pressure function, said extracting comprising
- identifying a first pressure peak in said registered pressure function;
- relating quantities from said first pressure peak to quantities of a first arcing of said switching action;
- relating said quantities of said first arcing to breaking a first contact of a diverter switch in said tap changer during said switching action; and
- diagnosing a switching condition associated with said first contact, the switching condition being an error condition when quantities are outside a predetermined interval.

19. The computer program product according to claim 18, wherein the computer code means or software portions are further for making a processor perform the step of supplying the computer code means or software portions via a network.

20. The computer program product according to claim 19, wherein the network is the internet.

* * * * *

UNITED STATES PATENT AND TRADEMARK OFFICE
CERTIFICATE OF CORRECTION

PATENT NO. : 7,145,760 B2  
APPLICATION NO. : 10/450579  
DATED : December 5, 2006  
INVENTOR(S) : Bengt-Olof Stenestam et al.

Page 1 of 1

It is certified that error appears in the above-identified patent and that said Letters Patent is hereby corrected as shown below:

Title Page; item (63);
The provisional patent application does not appear in the priority history of the patent. Please add the following:

Under the priority history listed on the face of the patent (Items (22) – (87)), the provisional patent application is missing. Please add:

--Provisional Application No. 60/255,424, Filed December 15, 2000--.

In column 1, Line 3, after the title, please add:

--This application is the national phase of PCT/SE01/02782, filed December 14, 2001, which claims priority to U.S. Provisional Application No. 60/255,424, Filed December 15, 2000--.

Signed and Sealed this

Twenty-eighth Day of July, 2009

JOHN DOLL  
*Acting Director of the United States Patent and Trademark Office*